United States Patent [19]
Barrett, Jr. et al.

[11] Patent Number: 5,651,037
[45] Date of Patent: Jul. 22, 1997

[54] APPARATUS FOR PREFORMING DISCRETE-TIME ANALOG QUEUING AND COMPUTING IN A COMMUNICATION SYSTEM

[75] Inventors: Raymond Louis Barrett, Jr., Ft. Lauderdale; Barry W. Herold, Boca Raton; Grazyna Anna Pajunen, Delray, all of Fla.

[73] Assignee: Motorola, Inc., Schaumburg, Ill.

[21] Appl. No.: 538,930

[22] Filed: Oct. 4, 1995

[51] Int. Cl.$^6$ ................................................ H03D 3/24
[52] U.S. Cl. .................................... 375/377; 375/316
[58] Field of Search .................................. 375/371, 376, 375/316, 377, 238; 340/825.79, 825.89

[56] References Cited

U.S. PATENT DOCUMENTS

| | | |
|---|---|---|
| 3,953,813 | 4/1976 | Yano et al. . |
| 4,167,711 | 9/1979 | Smoot ................................ 331/17 |
| 5,345,234 | 9/1994 | Stewart et al. ...................... 341/108 |
| 5,521,556 | 5/1996 | O'Shaughnessy et al. .......... 331/1 R |

OTHER PUBLICATIONS

Jacob Millman "Microelectronics Digital and Analog Circuits and System," McGraw Hill, 192–198, 276–290 1979.
"Analog VLSI and Neural Systems" by Carver Mead, pp. 67–82, 1989.

*Primary Examiner*—Tesfaldet Bocure
*Attorney, Agent, or Firm*—Gregg E. Rasor; R. Louis Breeden

[57] ABSTRACT

A communication receiver (100) utilizing a synthesizer (143) employs a discrete-time phase locked loop which includes a reference oscillator (135), a phase error detector (202), a discrete-time analog computing element (206), an integrator (210), a controlled frequency generator (211, 212), and a frequency divider (214). The discrete-time analog computing element implements a discrete-time analog lead-lag network circuit. This circuit includes a clock and logic circuit (216), at least one discrete-time analog queuing element (218), and an analog computing engine (222). The queuing element (218) includes N analog signal lines, N analog storage lines, N control lines, and $N^2$ controllable switches. Each controllable switch is coupled between each of the N analog signal lines and each of the N analog storage lines. In addition, N charge storage elements are coupled between each of the N analog storage lines and a common circuit node. The N control lines control the controllable switches in a predetermined sequence.

18 Claims, 10 Drawing Sheets

*143* ns, and more specifically to an apparatus for perform-
APPARATUS FOR PREFORMING DISCRETE-TIME ANALOG QUEUING AND COMPUTING IN A COMMUNICATION SYSTEM

FIELD OF THE INVENTION

This invention relates in general to radio communication systems, and more specifically to an apparatus for performing discrete-time analog queuing and computing in a radio communication system.

BACKGROUND OF THE INVENTION

Classical continuous-time frequency synthesizers, which can be programmed to two or more frequencies, inherently have noisy, frequency-unstable warm-up times during the reprogramming process. The same is true during initial power-up of the classical continuous-time frequency synthesizer. The warm-up time for a programmable frequency synthesizer is considered the time taken by the frequency synthesizer to switch from one operating frequency to a second operating frequency within a desired frequency lock range (e.g.,±10 Hz from the desired second operating frequency), or the time period needed to achieve a desired power-up frequency within a desired frequency lock range.

One source of the noisy warm-up time can arise from the combination of a pulse-width modulated sink-source-float phase error detector with a continuous-time lead-lag network. Such a combination is inherently noisy. A further disadvantage of using the continuous-time lead-lag network is a requirement for external (non-integratable) components to implement a practicable lead-lag network. Communication systems which utilize a frequency synthesizer of this type are adversely affected by the added cost of the external components, are inefficient in power consumption, thereby reducing battery life, and are further affected by manufacturing variations in the external components.

Thus, what is needed is an apparatus that overcomes the aforementioned problems. Preferably, the apparatus should be low cost, power efficient and substantially less noisy and unstable during the warm-up time.

SUMMARY OF THE INVENTION

An aspect of the present invention is a discrete-time analog queuing element. The discrete-time analog queuing element comprises N analog signal lines, wherein N is a positive integer. The discrete-time analog queuing element further comprises N analog storage lines, $N^2$ controllable switches, a controllable switch coupled between each of the N analog signal lines and each of the N analog storage lines, N charge storage elements, a charge storage element coupled between each of the N analog storage lines and a common circuit node, and N control lines. Each control line is coupled to N of the $N^2$ controllable switches. The control lines control the controllable switches in response to the control lines being activated in a predetermined sequence. Each of the analog storage lines is coupled in turn to each of the analog signal lines in a sequence having a predetermined rotating order, wherein the predetermined rotating order is identical for each of the analog storage lines, except that the sequence corresponding to each of the analog storage lines begins with a different one of the analog signal lines.

A second aspect of the present invention is a discrete-time analog computing element. The discrete-time analog computing element comprises an input node coupled to at least one discrete-time analog queuing element for receiving a discrete-time analog input signal, an output node coupled to the at least one discrete-time analog queuing element for providing a computed output signal responsive to the discrete-time analog input signal, a clock and logic circuit coupled to the at least one discrete-time analog queuing element for generating a plurality of control signals activated in a predetermined sequence, and the at least one discrete-time analog queuing element. The discrete-time analog queuing element comprises N analog signal lines, wherein N is a positive integer, N analog storage lines, $N^2$ controllable switches, a controllable switch coupled between each of the N analog signal lines and each of the N analog storage lines, N charge storage elements, a charge storage element coupled between each of the N analog storage lines and a common circuit node, and N control lines, each control line coupled to N of the $N^2$ controllable switches and coupled to the clock and logic circuit. The N control lines control the controllable switches in response to the control lines being activated in the predetermined sequence. Each of the analog storage lines is coupled in turn to each of the analog signal lines in a sequence having a predetermined rotating order, wherein the predetermined rotating order is identical for each of the analog storage lines, except that the sequence corresponding to each of the analog storage lines begins with a different one of the analog signal lines.

A third aspect of the present invention is a discrete-time phase locked loop. The discrete-time phase locked loop comprises a phase error detector having a discrete-time pulse width modulation (DTPWM) output signal, the phase error detector coupled to a reference signal and coupled to a generated signal for detecting a phase difference between the reference signal and the generated signal, and a discrete-time analog computing element. The discrete-time analog computing element comprises an input node coupled to the phase error detector and coupled to at least one discrete-time analog queuing element for receiving the DTPWM output signal, an output node coupled to the at least one discrete-time analog queuing element for providing a computed output signal responsive to the DTPWM output signal of the phase error detector, a clock and logic circuit coupled to the at least one discrete-time analog queuing element for generating a plurality of control signals activated in a predetermined sequence, and the at least one discrete-time analog queuing element. The discrete-time analog queuing element comprises N analog signal lines, wherein N is a positive integer, N analog storage lines, $N^2$ controllable switches, a controllable switch coupled between each of the N analog signal lines and each of the N analog storage lines, N charge storage elements, a charge storage element coupled between each of the N analog storage lines and a common circuit node, and N control lines, each control line coupled to N of the $N^2$ controllable switches and coupled to the clock and logic circuit. The N control lines control the controllable switches in response to the control lines being activated in the predetermined sequence. Each of the analog storage lines is coupled in turn to each of the analog signal lines in a sequence having a predetermined rotating order, wherein the predetermined rotating order is identical for each of the analog storage lines, except that the sequence corresponding to each of the analog storage lines begins with a different one of the analog signal lines. The discrete-time phase locked loop further comprises a controlled oscillator coupled to the output node of the discrete-time analog computing element for producing the generated signal.

A fourth aspect of the present invention is a communication receiver. The communication receiver comprises an antenna for intercepting a signal including information, a receiver element coupled to the antenna for demodulating the signal to derive the information, a processor coupled to the receiver element for processing the information, and a synthesizer coupled to the processor for producing a generated signal utilized by the communication receiver. The synthesizer comprises a reference oscillator for generating a reference signal, and a discrete-time phase locked loop, comprising a phase error detector having a discrete-time pulse width modulation (DTPWM) output signal, the phase error detector coupled to the reference oscillator for receiving the reference signal and coupled to the generated signal for detecting a phase difference between the reference signal and the generated signal, and a discrete-time analog computing element. The discrete-time analog computing element comprises an input node coupled to the phase error detector and coupled to at least one discrete-time analog queuing element for receiving the DTPWM output signal, an output node coupled to the at least one discrete-time analog queuing element for providing a computed output signal responsive to the DTPWM output signal of the phase error detector, a clock and logic circuit coupled to the at least one discrete-time analog queuing element for generating a plurality of control signals activated in a predetermined sequence, and the at least one discrete-time analog queuing element. The discrete-time analog queuing element comprises N analog signal lines, wherein N is a positive integer, N analog storage lines, $N^2$ controllable switches, a controllable switch coupled between each of the N analog signal lines and each of the N analog storage lines, N charge storage elements, a charge storage element coupled between each of the N analog storage lines and a common circuit node, and N control lines, each control line coupled to N of the $N^2$ controllable switches and coupled to the clock and logic circuit. The N control lines control the controllable switches in response to the control lines being activated in the predetermined sequence. Each of the analog storage lines is coupled in turn to each of the analog signal lines in a sequence having a predetermined rotating order, wherein the predetermined rotating order is identical for each of the analog storage lines, except that the sequence corresponding to each of the analog storage lines begins with a different one of the analog signal lines. The discrete-time phase locked loop further comprises a controlled oscillator coupled to the output node of the discrete-time analog computing element for producing the generated signal.

DESCRIPTION OF THE PREFERRED EMBODIMENT

Figure 1:
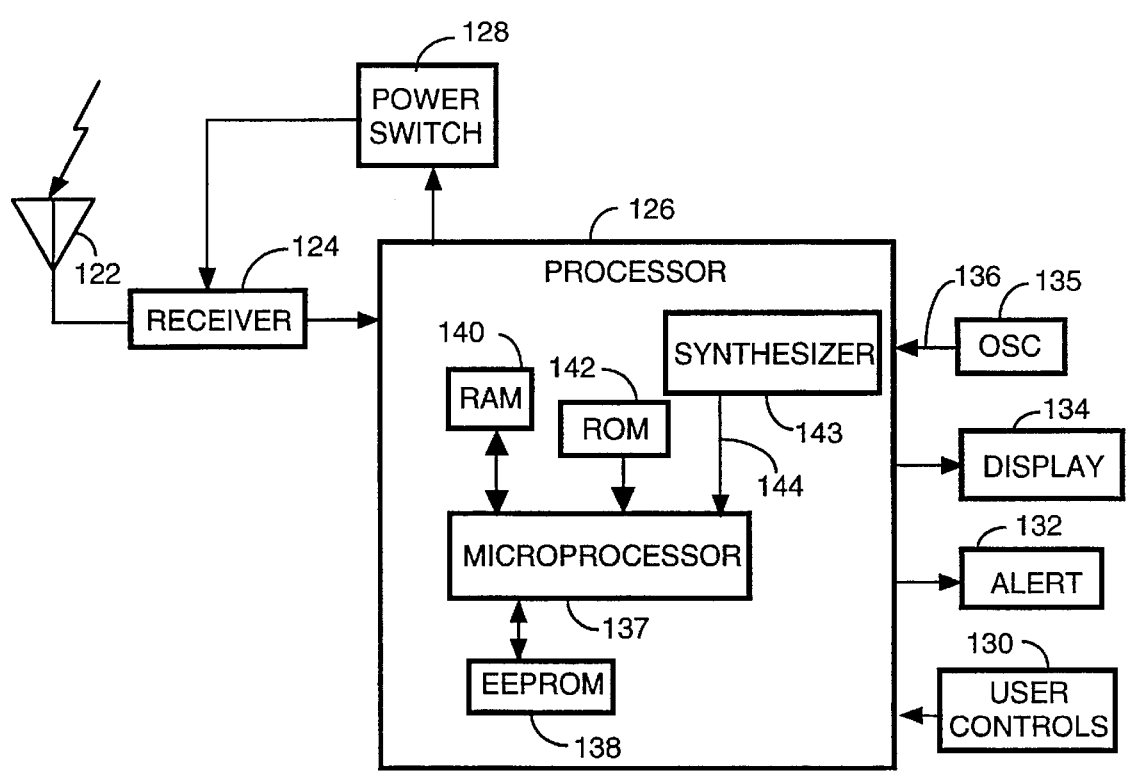
FIG. 1 is an electrical block diagram of a communication receiver employing a frequency synthesizer with a discrete-time analog phase lock loop in accordance with the present invention.

FIG. 1 is an electrical block diagram of a communication receiver 100 in accordance with the preferred embodiment of the present invention. The communication receiver 100 includes a receiver antenna 122 for intercepting radio frequency (RF) signals comprising messages from a transmitting station (not shown). The receiver antenna 122 is coupled to a receiver 124 applying conventional demodulation techniques for receiving the RF signals. Once the RF signals have been demodulated, the receiver 124 generates demodulated message information which is presented to a processor 126 for processing.

A conventional power switch 128, coupled to the processor 126, is used to control the supply of power to the receiver 124, thereby providing a battery saving function.

To perform the necessary functions of the communication receiver 100, the processor 126 includes a microprocessor 137, a random access memory (RAM) 140, a read-only memory (ROM) 142, an electrically erasable programmable read-only memory (EEPROM) 138, and a frequency synthesizer 143 in accordance with the present invention.

Preferably, the microprocessor 137 is similar to the M68HC08 micro-controller manufactured by Motorola, Inc. It will be appreciated that other similar processors can be utilized for the microprocessor 137, and that additional processors of the same or alternative type can be added as required to handle the processing requirements of the processor 126. It will also be appreciated that other types of memory, e.g., EEPROM or FLASH, can be utilized for the ROM 142, as well as the RAM 140. It will be further appreciated that the RAM 140 and the ROM 142, singly or in combination, can be integrated as an integral portion of the processor 126.

The processor 126 is programmed by way of the ROM 142 to process incoming messages transmitted by the transmitting station. During message processing, the processor 126 decodes in a conventional manner an address in the demodulated message information, compares the decoded address with one or more addresses stored in the EEPROM 138, and when a match is detected, the processor 126 proceeds to process the remaining portion of the message.

Once the processor 126 has processed the message, it stores the message in the RAM 140, and a call alerting signal is generated to alert a user that a message has been received. The call alerting signal is directed to a conventional audible or tactile alerting device 132 for generating an audible or tactile call alerting signal.

The message can be accessed by the user through user controls 130, which provide functions such as lock, unlock, delete, read, etc. More specifically, by the use of appropriate functions provided by the user controls 130, the message is recovered from the RAM 140, and then conveyed to the user by way of an information interface comprising a display 134 for displaying the message, e.g., a conventional liquid crystal display (LCD).

The microprocessor 137 is also coupled to the frequency synthesizer 143 providing the function of a phase-locked loop (PLL) utilized for clock generation to the core circuitry of the microprocessor 137. The frequency synthesizer 143 is also coupled to a time base reference oscillator 135 for generating a reference signal 136.

Figure 2:
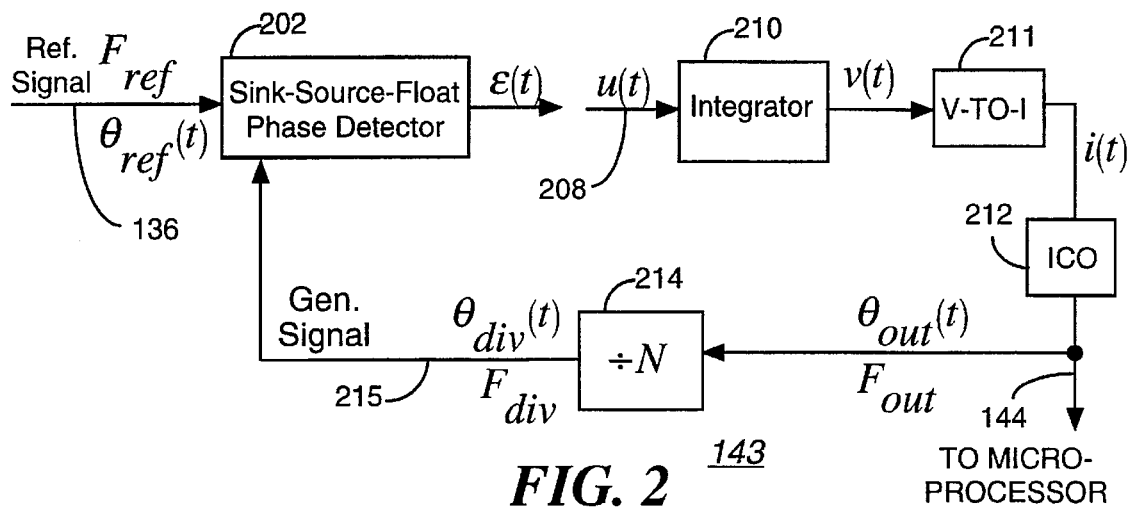
FIG. 2 is an open loop electrical block diagram of the synthesizer of FIG. 1.

FIG. 2 is an open loop electrical block diagram of the frequency synthesizer 143 of FIG. 1. The open loop block diagram includes a conventional sink-source-float (SSF) phase detector 202, a conventional integrator 210, a conventional voltage-to-current (V-TO-I) converter 211, a conventional current-controlled oscillator (ICO) 212, and a conventional divide by N frequency divider 214.

The sink-source-float phase detector 202 is coupled to the reference signal 136 with frequency $F_{ref}$ (or equivalent phase $\theta_{ref}(t)$) generated by the time base reference oscillator 135, and is coupled to a generated signal 215 derived from the divide by N frequency divider 214. Once the sink-source-float phase detector 202 has calculated the phase difference between the reference signal 136 and the generate signal 215 a phase error signal $\epsilon(t)$ is created.

The integrator 210 receives the phase error signal $\epsilon(t)$ processed in the form of a signal u(t) (to be derived below). The integrator generates a control signal v(t) which is converted to a current by the V-TO-I converter 211. The current signal i(t) generated by the V-TO-I converter 211 is coupled to the input of the ICO 212.

The ICO 212 in response to the current signal i(t) generates a desired signal at a desired frequency $F_{out}$ (or equivalent phase $\theta_{out}(t)$) which is coupled to the divide by N frequency divider 214.

The divide by N frequency divider 214 divides the frequency $F_{out}$ by a factor of N thereby generating a divided frequency $F_{div}$ (or equivalent phase $\theta_{div}(t)$).

To determine the open loop transfer function G(s) of the circuit of FIG. 2 the transfer function of each block must be determined. As is well known by one of ordinary skill in the art, the sink-source-float phase detector 202 can be modeled by the transfer function $$\epsilon(s) = K_p \cdot \theta(s) \cdot e^{-(s \cdot T)}$$

where $K_p$ is a constant determined by the gain of the phase detector 202, $$T = \frac{1}{F_{ref}}, \text{ and } \theta(s) = \theta_{ref}(s) - \theta_{div}(s).$$

Similarly the transfer function of the integrator can be expressed as $$V(s) = \frac{1}{s} \cdot U(s).$$

The transfer function of the V-TO-I converter 211 in combination with the ICO 212 can be expressed as $$\theta_{out}(s) = \frac{K_v}{s} \cdot V(s),$$

where $K_v$ is a constant. Finally, the transfer function of the divide by N frequency divider 214 can be expressed as $$\theta_{div}(s) = \frac{1}{N} \cdot \theta_{out}(s).$$

Including the above transfer functions in the expression $$\epsilon(s) = K_p \cdot [\theta_{ref}(s) - \theta_{div}(s)] \cdot e^{-(s \cdot T)}$$

gives the result $$\epsilon(s) = K_p \cdot e^{-(s \cdot T)} \cdot \theta_{ref}(s) - \frac{K_p \cdot K_v}{N} \cdot \frac{e^{-(s \cdot T)}}{s^2} \cdot U(s).$$

Arbitrarily letting U(s)=H(s)·$\epsilon$(s) gives the result $$\theta_{out}(s) = \frac{K_p \cdot K_v \cdot \frac{e^{-(s \cdot T)}}{s^2} \cdot H(s)}{\left[1 + \frac{K_p \cdot K_v}{N} \cdot \frac{e^{-(s \cdot T)}}{s^2} \cdot H(s)\right]} \cdot \theta_{ref}(s).$$

Letting G(s) equal $$G(s) = \frac{K_p \cdot K_v}{N} \cdot \frac{e^{-(s \cdot T)}}{s^2}$$

then the above equation for $\theta_{out}(S)$ can be rewritten as $$\frac{\theta_{out}(s)}{\theta_{ref}(s)} = N \cdot \left[\frac{G(s) \cdot H(s)}{1 + G(s) \cdot H(s)}\right].$$

Figure 3:
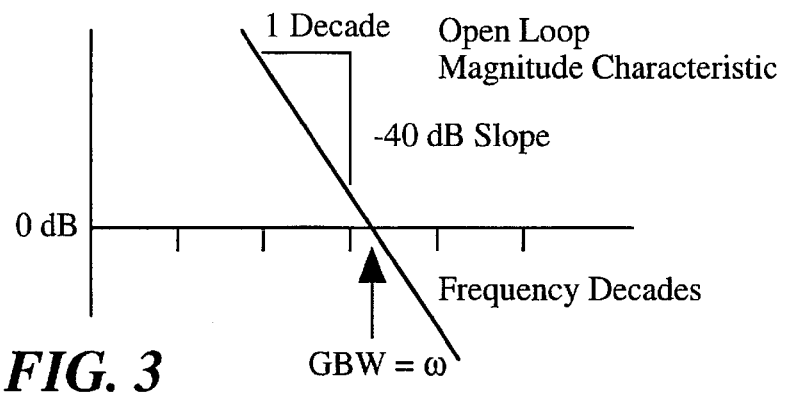
FIG. 3 is an open loop magnitude diagram of the synthesizer of FIG. 1.

Letting $$K = \frac{K_p \cdot K_v}{N},$$

then G(s) can be thought of as a double integrator with a characteristic frequency defined by $K=\omega^2$, combined with a delay of T seconds, which provides a frequency dependent phase. Using a Bode Plot representation as shown in FIG. 3, the double integrator provides a magnitude slope of −40 dB per decade, with the Gain Band Width (GBW) of zero dB at $\omega=\sqrt{K}$, and a constant −180 degree phase characteristic, while the delay provides a constant 0 dB magnitude (unaffecting the double integrator magnitude characteristics), but providing constant frequency dependent phase slope adding from 0 degrees at DC to −360 degrees additional at $F_{Ref}$.

Figure 4:
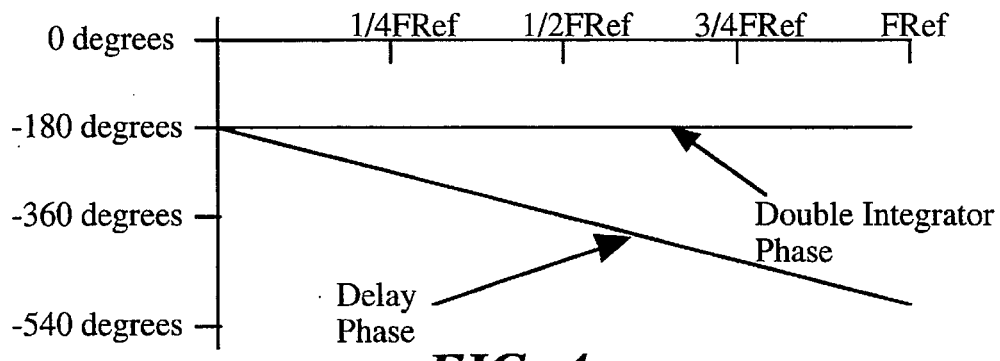
FIG. 4 is an open loop phase diagram of the synthesizer of FIG. 1.

Note, that while the magnitude characteristic illustrated above in FIG. 3 is shown with the magnitudes in decibels (dB) and a logarithmic frequency axis, it is more natural to show the phase characteristic below in FIG. 4 with arithmetic phase values in degrees and an arithmetic frequency axis. The frequency scales are chosen differently to simplify the illustrations to straight lines in their respective representations.

Figure 5:
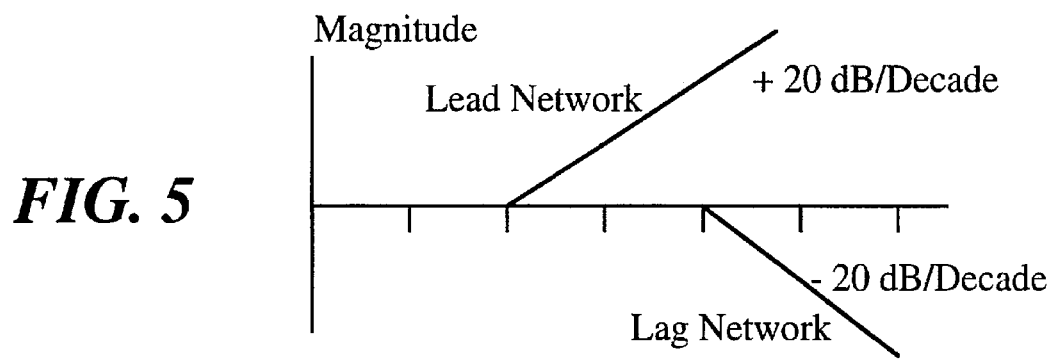
FIG. 5 is a magnitude diagram of a lead-lag network.
Figure 6:
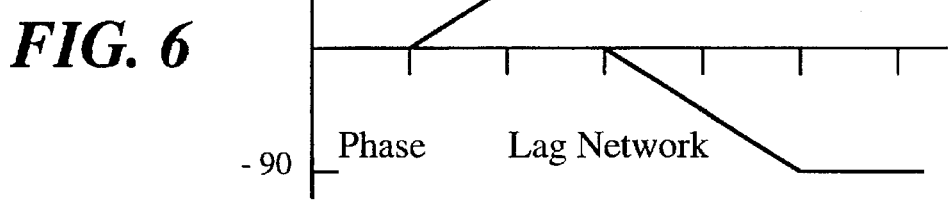
FIG. 6 is a phase diagram of a lead-lag network.

With a double integrator alone, classical feedback theory shows that the phase margin is zero, while the SSF delay worsens the situation. An appropriate controller can be designed to eliminate this problem. A relatively simple controller design can be achieved by configuring H(s) to include a lead-lag compensation network, and this is the usual practice. Such a compensation network introduces a positive phase slope of 45 degrees per decade, beginning one decade below its zero frequency, and introduces a negative phase slope of 45 degrees per decade, beginning one decade below its pole frequency. FIGS. 5 and 6 show the lead-lag magnitude and phase characteristics, respectively.

The asymptotic behaviors of a zero are used to provide the lead behaviors, and the asymptotic behaviors of a pole are used to provide the lag behaviors. The zero is introduced at a lower frequency than the pole, providing up to 90 degrees of compensating asymptotic phase shift, before the introduction of the pole reduces the phase shift back to zero. The zero introduces asymptotic phase shift beginning at a frequency one decade below the zero's characteristic frequency and ending one decade above the zero's characteristic frequency. The phase slope of the zero is +45 degrees per decade and results in a maximum of +90 degrees asymptotic phase shift, while the pole, in turn removes all phase shift introduced by the zero, beginning at a frequency one decade below the pole's characteristic frequency.

Figure 7:
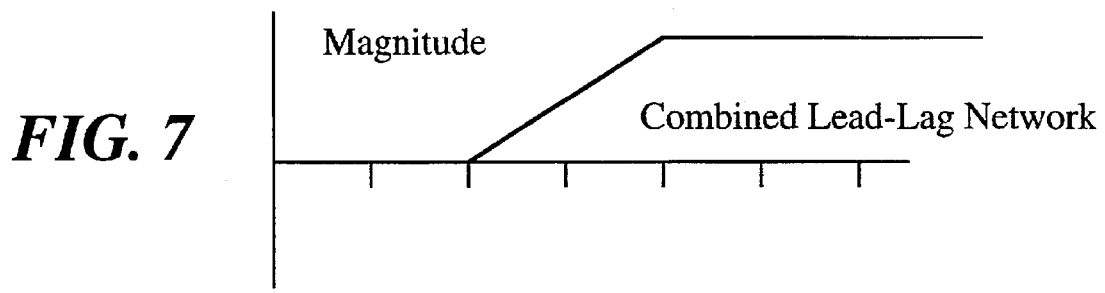
FIG. 7 is a resultant magnitude diagram of a lead-lag network.
Figure 8:
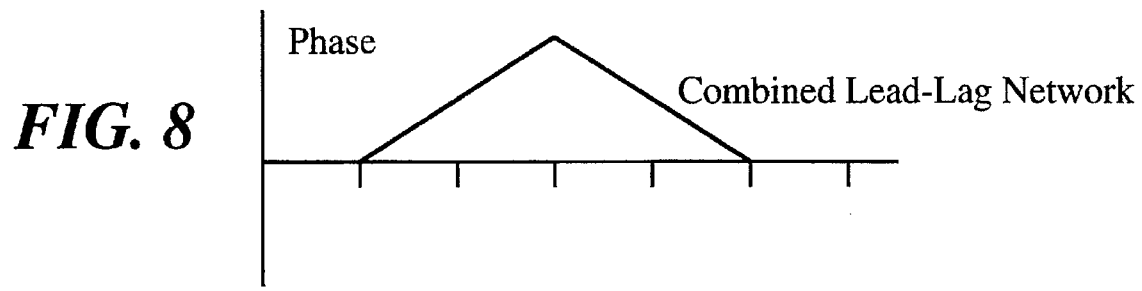
FIG. 8 is a resultant phase diagram of a lead-lag network.

It is immediately apparent that a phase contribution of a possible +90 degrees can do a great deal to stabilize the loop gain of the PLL, but there are limits. The limits deal primarily with the maximum frequency that can be chosen for the GBW of the closed loop, and hence affect the speed of response of the loop. For the sake of illustration, a lead-lag network is configured with the zero a full two decades below the pole, asymptotically providing the maximum phase compensation possible of +90 degrees. The asymptotic characteristics of such a network are shown in the following illustration, but the asymptotic values illustrated are not achievable in practice, and are shown here only for the purposes of developing a practicable classical design. FIGS. 7 and 8 show the resultant magnitude and phase diagrams of the combined lead-lag network.

An absolute maximum limit can be established for the GBW, if the frequency at which the phase margin can just be made zero is chosen, and hence no frequency above that can be compensated with any remaining phase margin. This maximum can be established simply from the observation that the phase margin is identically zero from the action of the double integrator alone, and further reduced by the straight line phase slope of the delay. A positive phase compensation of +90 degrees is just enough to compensate for the phase introduced by the delay when that phase decreases to −90 degrees. Since the phase slope is linear, and −360 degrees is introduced at $F_{Ref}$ −90 degrees is introduced at 25% of $F_{Ref}$. With the assumptions made above, there is no possible way a lead-lag network can achieve a GBW greater than 25% of $F_{Ref}$.

To design a practicable set of values for a lead-lag network, the pole is designed for a frequency that is 16 times the zero frequency (the pole is 4 octaves above the zero). Using a network with a single resistor and two capacitors, the frequency ratio is 1 plus the ratio of capacitance values, (a ratio of capacitor values of 15 was chosen which is a standard manufacturing ratio), and the actual peak phase compensation is about 62 degrees. The lead-lag zero compensation has its peak phase effect at the geometric mean of the pole and zero frequencies (2 octaves from each) and therefore, the frequency geometrically mid-way between the zero and the pole is the closed loop GBW, since that is the frequency at which the compensation is desired for best phase margin. The zero is located two octaves below the peak phase frequency, and the pole is located two octaves above it.

Further, to provide the best compromise between settling time and phase margin, the GBW must be designed to be approximately 7% of $F_{Ref}$. At 7% of $F_{Ref}$ the delay introduces 0.07 times −360 degrees, or about −25 degrees, reducing the phase compensation to 62−25=37 degrees of phase margin. Such phase margin in a closed loop response results in behavior that is clearly resonant at the GBW natural frequency, but typically settles to an acceptable frequency error in about 3 to 4 cycles of the natural frequency.

A closed loop GBW can be established at a slightly higher frequency, at the cost of phase margin, more pronounced resonance, and increased settling time. Again, a closed loop GBW can be established at a slightly lower frequency, gaining phase margin, with less pronounced resonance, but the lower natural frequency also results in increased settling time. Extensive simulation reveals the optimum GBW to be $0.07 \cdot F_{Ref}$ with the lead-lag network designed for a pole frequency that is 16 times the zero frequency.

Figure 9:
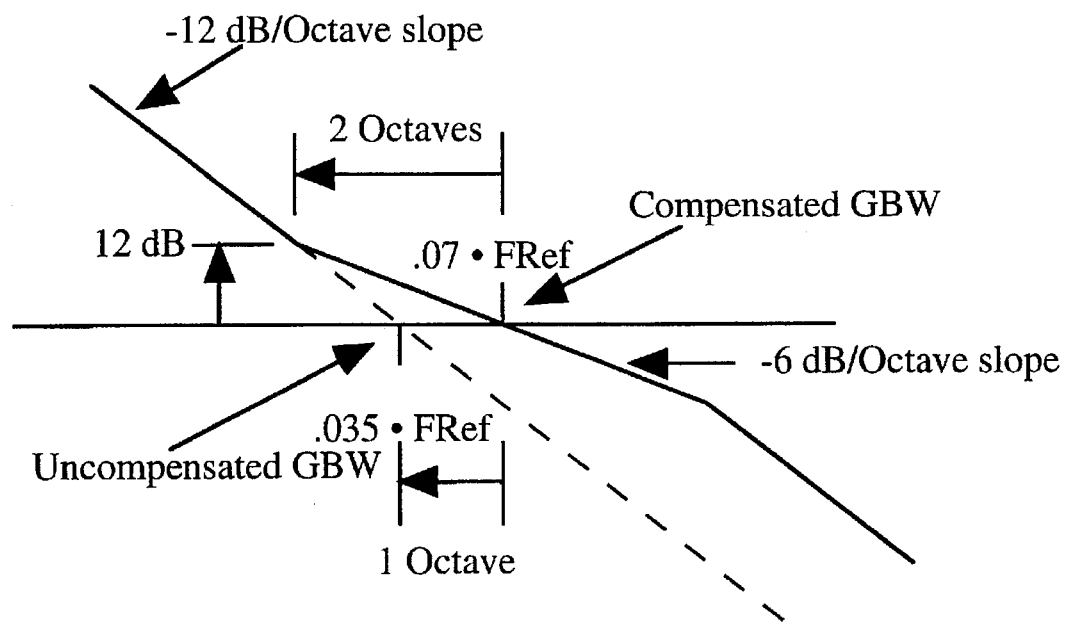
FIG. 9 is an illustration of compensated gain band width.

To achieve the results discussed above, the design procedure begins with the known achievable closed loop GBW. The design further proceeds in selection of the lead-lag pole and zero frequencies to the only possible open loop GBW that achieves the desired closed loop GBW. While a more widely separated pole-zero pair does slightly improve GBW, the particular choice of four octaves separation range for the lead-lag network simplifies the design procedure considerably, as can be seen from the following illustration in FIG. 9, and is used for the remainder of the discussion of performance of the classically controlled PLL.

With the closed loop GBW determined, the open-loop GBW is likewise determined by the asymptotic gain slope, i.e. the argument that the zero, two octaves below the closed loop GBW, is at +12 dB (−6 dB per octave gain slope for two octaves), while the open loop would decrease that +12 dB to 0 dB in one octave (−12 dB per octave gain slope for one octave), and hence the open loop, uncompensated GBW must be at the remaining one octave below the closed loop GBW.

Since the GBW is $0.07 \cdot F_{Ref}$ the period associated with the GBW natural frequency is about 14.28 cycles of the reference, and settling is satisfactory in about 3 to 4 cycles of the natural frequency, which is 43 to 57 cycles of the reference frequency. Only very slightly better results are obtained if the pole and zero are further separated, but sampling noise considerations prevent very wide separations.

Implementation issues of PLL systems that use the sink-source-float phase detector include the response of the system to various internal and external sources of noise, the noise introduced by the sampling process, the settling time, the sensitivity of the design solution to variations in the components, and the effect of changes in loop gain with changes in the frequency divider.

As a first issue, to compensate G(s) the lead-lag transfer function is needed for one type of classical controller:

$$H(s) = \frac{\frac{s}{\omega_z}+1}{\frac{s}{\omega_\pi}+1}, \text{ or } H(s) = \frac{\frac{s}{(0.0175\omega_{ref})}+1}{\frac{s}{(0.28\omega_{ref})}+1}.$$

A technique exists for discrete-time computation of control signals, therefore it becomes desirable to discretize the above continuous-time lead-lag filter function. This is done by utilizing the well-known bilinear transform employing the substitution:

$$s = C \cdot \frac{1-z^{-1}}{1+z^{-1}}$$

and employing the parameterization $k_z=4/0.07w_{ref}$ and $k_p=0.25/0.07w_{ref}$, so that $$H(z) = \frac{(1+k_zC)+(1-k_zC)z^{-1}}{(1+k_pC)+(1-k_pC)z^{-1}}.$$

Letting $C=m\cdot 0.07w_{ref}$ leads to $k_z=4$ m, $k_p=0.25$ m, and $$H(z) = \frac{(1+4m)+(1-4m)z^{-1}}{(1+m/4)+(1-m/4)z^{-1}}.$$

Figure 10:
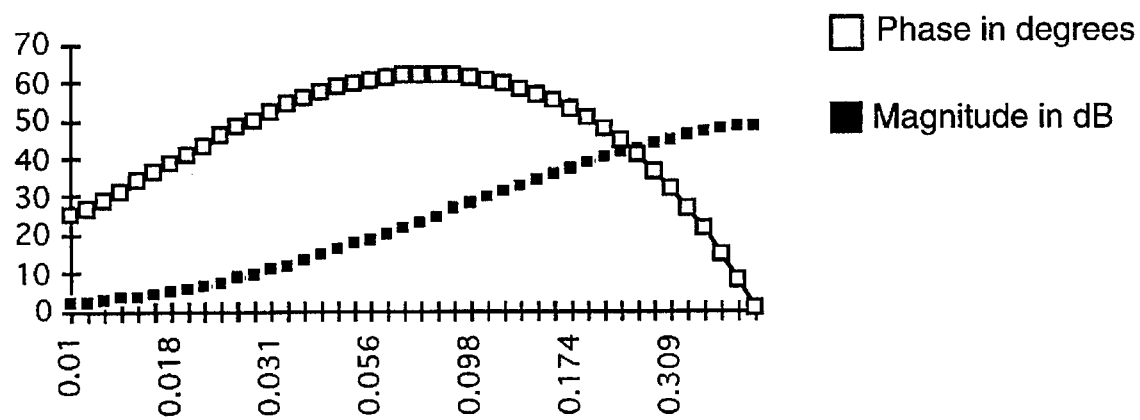
FIG. 10 is a simulation illustrating the lead-lag network with m=4.

Substituting $z=e^{j2\pi r}=\cos 2\pi r+j\sin 2\pi r$, and letting m=4, results in $$H(z) = \frac{17-15z^{-1}}{2} \Rightarrow H(r) = \frac{17-15(\cos 2\pi r - j\sin 2\pi r)}{2}$$

which plots as shown in FIG. 10. Recalling that U(s)=H(s)·e(s) and employing the above substitution results in the expression $$U(z) = \left\{ \frac{17}{2} - \frac{15}{2} z^{-1} \right\} \cdot e(z)$$

which defines the transfer function of the controller using a discrete-time lead-lag transfer function.

Figure 11:
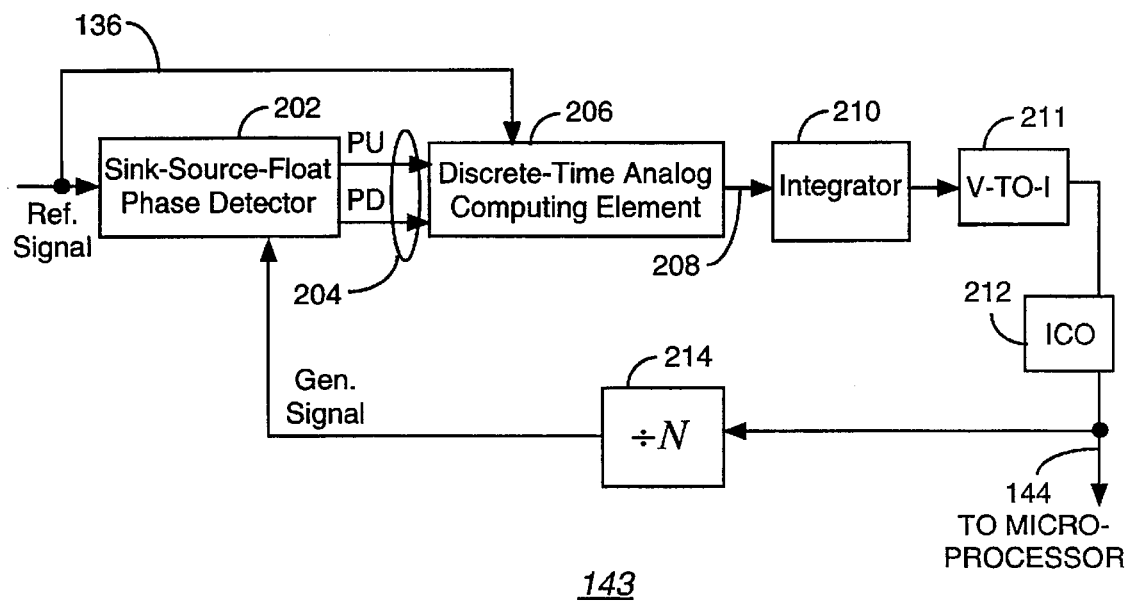
FIG. 11 is a closed loop electrical block diagram of the synthesizer of FIG. 1 in accordance with the preferred embodiment of the present invention.

FIG. 11 is a closed loop electrical block diagram of the frequency synthesizer 143 of FIG. 1 in accordance with the preferred embodiment of the present invention. The synthesizer 143 includes the same elements as functionally described in FIG. 2 with the addition of a discrete-time analog computing element 206 which implements the discrete-time lead-lag transfer function [U(z)] derived above.

Figure 12:
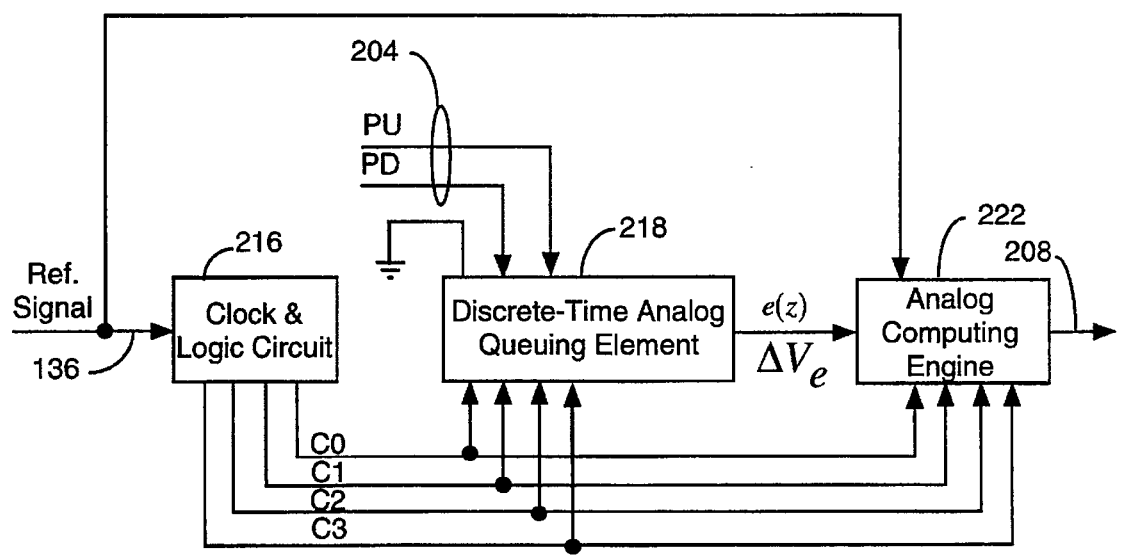
FIG. 12 is an electrical block diagram of a discrete-time analog computing element in accordance with the preferred embodiment of the present invention.

FIG. 12 is an electrical block diagram of the discrete-time analog computing element 206 in accordance with the preferred embodiment of the present invention. The discrete-time analog computing element 206 comprises a clock and logic generator circuit 216, a discrete-time analog queuing element 218, and an analog computing engine 222.

The clock and logic circuit 216 is driven by the reference signal 136 generated by the oscillator 135. The clock and logic circuit 216 preferably utilizes a conventional Johnson Counter to produce glitchless clock outputs (C0 through C3). Only one clock bit is active-high (i.e., a binary one) at one time. The clock outputs are coupled to both the discrete-time analog queuing element 218 and the analog computing engine 222.

The discrete-time analog queuing element 218 is coupled to an input node 204 comprising a pull-up (PU) and pull-down (PD) signals which are sourced by the sink-source-float phase detector 202. As is well known by one of ordinary skill in the art, only one of the input node 204 signals is active at one time. Although the inactive signal may contain a short glitch, it is considered negligible for this application. The discrete-time analog queuing element 218 is also coupled to a ground signal reference for reset purposes (as will be described below), and a signal line labeled as e(z) (or equivalently $\Delta V_e$).

The e(z) signal generated by the discrete-time analog queuing element 218 is coupled to the input of the analog computing engine 222. Similarly, the analog computing engine 222 is coupled to the clock signals of the clock and logic circuit 216, and the reference signal 136. Once the analog computing engine 222 has completed a computation, an output node 208 of the analog computing engine 222 generates a signal which is coupled to the input of the integrator 210 of FIG. 11.

The integrator 210 therein processes the signal generated by the discrete-time analog computing element 208 and creates a signal which is coupled to the V-TO-I converter 211. The current signal generated by the V-TO-I converter 211 is coupled to the ICO 212, thereby controlling the frequency signal 144 generated. The frequency signal 144 is coupled to both the microprocessor 137 and the divide by N frequency divider 214. The generated signal created by the divide by N frequency divider 214 is coupled to the sink-source-float phase detector 202. The sink-source-float phase detector 202 continuously samples the reference signal 136 and the generated signal to generate a plurality of discrete-time phase error samples. Each discrete-time phase error sample feeds into the discrete-time analog computing element 206 therein commencing a new cycle in frequency adjustment. The process continuous until the frequency synthesizer 143 achieves phase lock.

Figure 13:
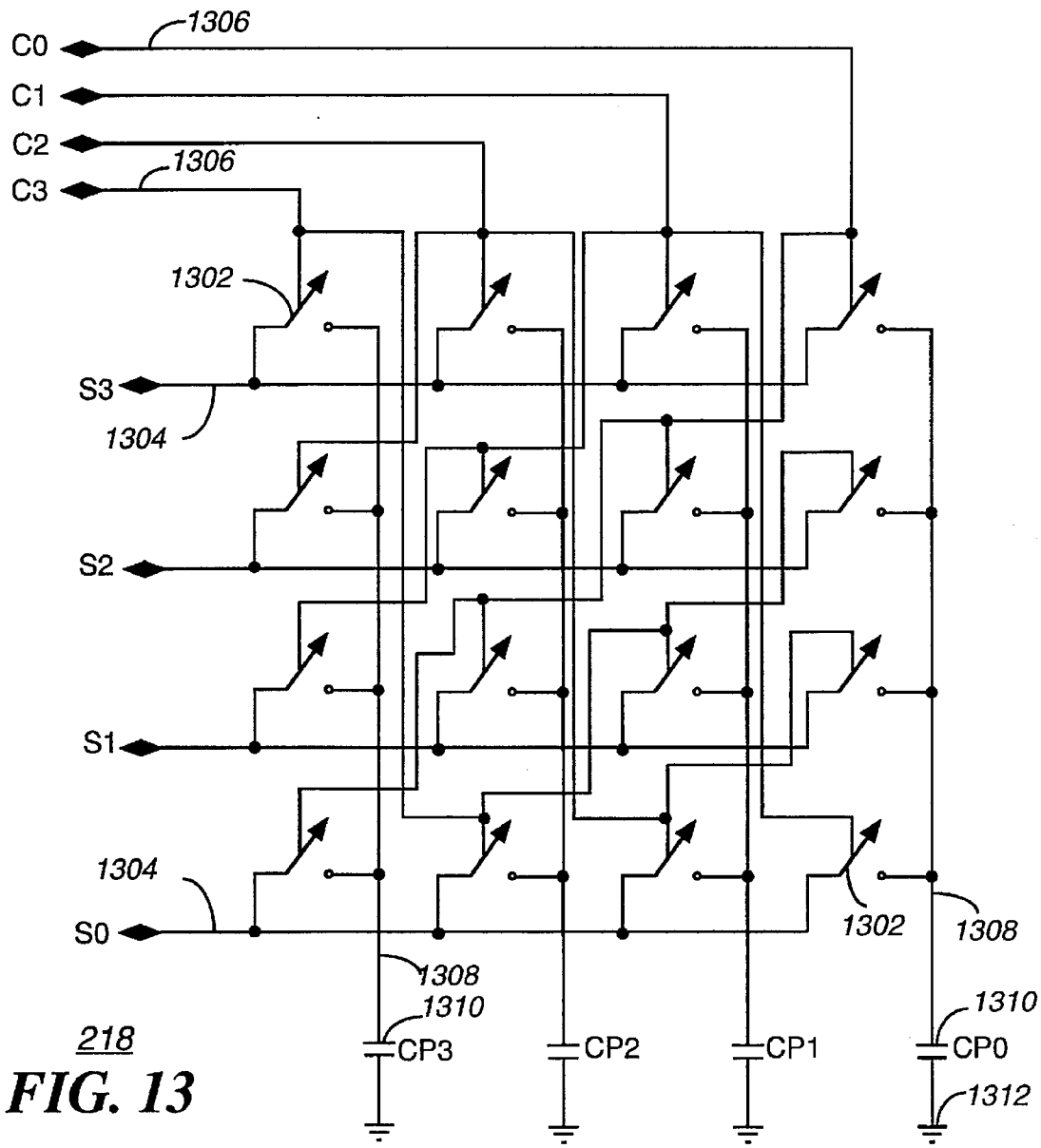
FIG. 13 is a detailed electrical block diagram of the switching matrix included in the discrete-time analog queuing element in accordance with the preferred embodiment of the present invention.

FIG. 13 is a detailed electrical block diagram of the switching matrix included in the discrete-time analog queuing element 218 in accordance with the preferred embodiment of the present invention. The discrete-time analog queuing element 218 comprises N analog signal lines 1304, wherein N is a positive integer, N analog storage lines 1308, and N control lines 1306. The discrete-time analog queuing element 218 further includes $N^2$ controllable switches 1302. The controllable switches 1302 preferably utilize conventional transmission gate switches, similar to the Motorola MC4066 switch manufactured by Motorola, Inc. Each controllable switch 1302 is coupled between one of the N analog signal lines 1304 and one of the N analog storage lines 1308. There are also N charge storage elements 1310. Each charge storage element 1310 is coupled between one of the N analog storage lines 1308 and a common circuit node 1312 (i.e., signal ground).

Each control line 1306 is coupled to N of the $N^2$ controllable switches 1302, and controls the controllable switches 1302 in response to the control lines 1306 being activated in a predetermined sequence. Each of the analog storage lines 1308 is coupled in turn to each of the analog signal lines 1304 in a sequence having a predetermined rotating order, wherein the predetermined rotating order is identical for each of the analog storage lines 1308, except that the sequence corresponding to each of the analog storage lines 1308 begins with a different one of the analog signal lines 1304.

In this example N=4. Therefore, there are four control lines 1306 (C0 through C3), four analog signal lines 1304 (S0 through S3), four analog storage lines 1308, sixteen controllable switches 1302, and four charge storage elements 1310 (CP0 through CP3).

Figure 14:
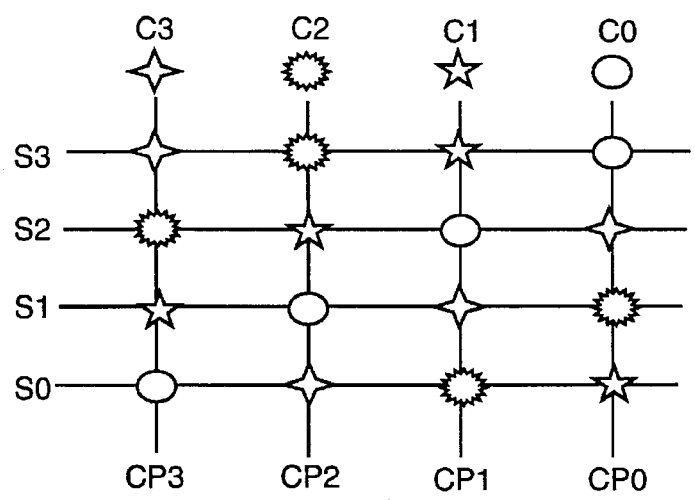
FIG. 14 is an illustration of the interconnectivity of the switching matrix included in the discrete-time analog queuing element in accordance with the preferred embodiment of the present invention.

FIG. 14 is an illustration of the interconnectivity of the controllable switches 1302 of the discrete-time analog queuing element 218 in accordance with the preferred embodiment of the present invention. For illustration purposes the control lines 1306 have each been given symbol. Recalling that only one control line 1306 is active at one time, when control line C0 is active only the switches 1302 with C0's symbol are closed. That is, S3 is connected with CP0, S2 is connected to CP1, S1 is connected with CP2, and S0 is connected with CP0. When C1 is active, S3 is connected to CP1, S2 is connected to CP2, S1 is connected to CP3, and S0 is connected to CP0. Operation in response to C2 and C3 is similar to that in response to C0 and C1.

The discrete-time analog queuing element 218 of FIGS. 12 and 13 has the analog signal line S0 connected to a reference circuit node, such as signal ground (G) for setting a predetermined charge and resultant voltage, e.g., zero volts, on the charge storage elements 1310. S1 is connected to PD, S2 connected to PU, and S3 generates the output signal e(z) or equivalently $\Delta V_e$. The table below shows how signals are queued in by the discrete-time analog queuing element 218.

TABLE 1

Queuing Example

|    | CP3 | CP2 | CP1 | CP0 |
|----|-----|-----|-----|-----|
| C1 | PD  | PU  | S3  | G   |
| C2 | PU  | S3  | G   | PD  |
| C3 | S3  | G   | PD  | PU  |
| C0 | G   | PD  | PU  | S3  |
| C1 | PD  | PU  | S3  | G   |
| C2 | PU  | S3  | G   | PD  |
| C3 | S3  | G   | PD  | PU  |

Table 1 shows an example queuing sequence of the discrete-time analog queuing element 218. Each column represents a charge storage element in the switch matrix, while each row is a single active control line. Recall that only one control line is active at each instance of the reference signal 136. The first row shows the control signal C1 active. During this time, the PD signal generated by the sink-source-float phase detector 202 is connected by the sink-source-float phase detector 202 is connected to CP2, the source signal S3 which generates e(z) is connected to CP1, and CP0 is connected to ground (i.e., reset). Similarly, when control line C2 is active CP3 is connected to the PU signal, CP2 is connected to the source signal S3, CP1 is reset, and CP0 is connected to the PD signal. Note as previously mentioned, only one of the PU and PD signals generated by the sink-source-float phase detector 202 is active at one time. Therefore, when a control line is active either PU or PD is ineffectual. Also note, as highlighted, that the sequence of queuing is a reset, followed on the next control cycle by PD, followed by PU, and finally followed by S3 where the stored signal is delivered as the e(z) signal. Essentially the discrete-time analog queuing element 218 provides a discrete-time analog queue for the signal e(z), delivering one phase error sample per cycle of the reference signal 136.

Figure 15:
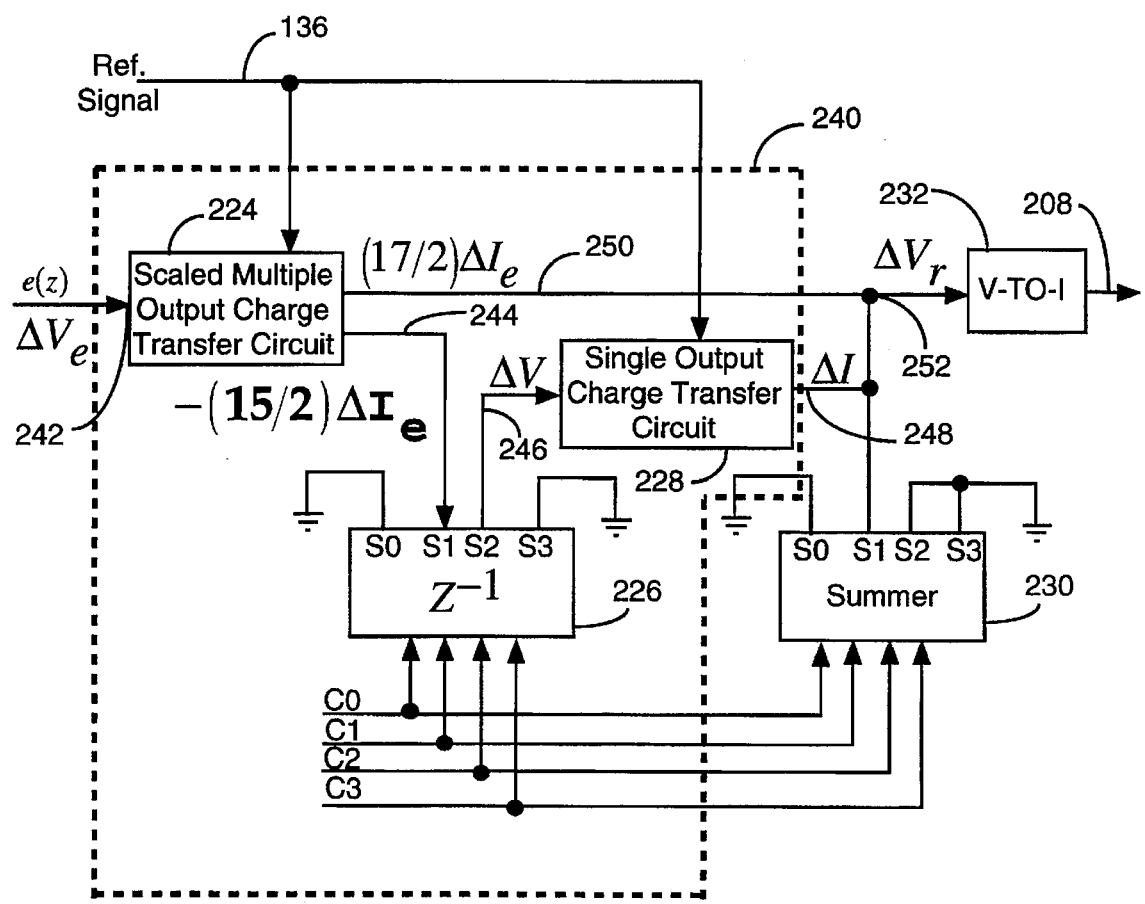
FIG. 15 is a detailed electrical block diagram of an analog computing engine in accordance with the preferred embodiment of the present invention.

FIG. 15 is a detailed electrical block diagram of the analog computing engine 222 in accordance with the preferred embodiment of the present invention. Once e(z) has been generated, the analog computing engine 222 applies the discrete-time lead-lag transfer function to e(z), that is, $$U(z) = \left\{ \frac{17}{2} - \frac{15}{2} z^{-1} \right\} \cdot e(z).$$

The analog computing engine 222 includes another discrete-time analog queuing element 240, expanded to comprise a scaled multiple output charge transfer circuit 224, a discrete-time analog queuing element similar to the discrete-time analog queuing element 218, but connected in a way as to function as a single clock delay $z^{-1}$ element 226, and a single output charge transfer circuit 228. The charge transfer circuit 224 has an input 242 for receiving the error signal e(z) in the form of a voltage change $\Delta V_e$ and a first output 250 coupled to a summing node 252. The charge transfer circuit 224 also has a second output 244 coupled to one of the analog signal lines S1 of the single clock delay element 226 for delivering thereto a charge proportional to the input voltage change $\Delta V_e$. The charge transfer circuit 228 has an input 246 coupled to one of the analog signal lines S2 of the single clock delay element 226 for receiving therefrom an input voltage change $\Delta V$. The charge transfer circuit 228 also has an output 248 for providing a current pulse signal $\Delta I$ comprising a charge proportional to $\Delta V$. The analog computing engine 222 also includes another discrete-time analog queuing element similar to the discrete-time analog queuing element 218, but connected in a way as to function as a summer 230, and a voltage-to-current converter (V-TO-I) 232.

The scaled multiple output charge transfer circuit 224 further receives the reference signal 136 for clocking the charge transfer circuit, as will be described shortly below. The voltage signal $\Delta V_e$ is converted and scaled to two current pulses $(17/2)\Delta I_e$ and $-(15/2)\Delta I_e$.

The current pulse $-(15/2)\Delta I_e$ is coupled to the single clock delay $Z^{-1}$ element 226 which delays the generation of the equivalent voltage pulse $\Delta V$ by one clock cycle of the reference signal 136. To configure a discrete-time queuing element 218 as a single clock delay $z^{-1}$ element 226 the analog signal lines are connected such that S3 is connected to ground, S2 is connected to $\Delta V$, S1 is connected to $-(15/2)\Delta I_e$, and S0 is connected to ground. Table 2 illustrates how the current pulse $-(15/2)\Delta I_e$ is delayed by one clock cycle thereby generating the voltage pulse $\Delta V$.

TABLE 2

Signal Sequence for Single Clock Delay Discrete-Time Analog Queuing Element

|    | CP3 | CP2 | CP1 | CP0 |
|----|-----|-----|-----|-----|
| C1 | $-(15/2)\Delta I_e$ | $\Delta V$ | G | G |
| C2 | $\Delta V$ | G | G | $-(15/2)\Delta I_e$ |
| C3 | G | G | $-(15/2)\Delta I_e$ | $\Delta V$ |
| C0 | G | $-(15/2)\Delta I_e$ | $\Delta V$ | G |
| C1 | $-(15/2)\Delta I_e$ | $\Delta V$ | G | G |
| C2 | $\Delta V$ | G | G | $-(15/2)\Delta I_e$ |

The highlighted sections of Table 2 illustrate the sequence of events which result in a single clock delayed output of the signal $-(15/2)\Delta I_e$. For example, at C1 CP0 is reset (i.e., grounded). At C2, CP0 receives the pulse signal $-(15/2)\Delta I_e$ which is stored as a charge voltage $\Delta V$. One clock cycle later of the reference signal 136 when C3 is active, CP0 sources the output signal ΔV. Note the same sequence rotates from CP0 through CP3.

The voltage pulse ΔV is coupled to the single output charge transfer circuit 228 which converts the pulse signal to an equivalent current pulse signal ΔI. The current pulse signal ΔI is then combined simultaneously with the current pulse signal $(17/2)\Delta I_e$ in the summer 230 generating a resultant voltage pulse signal $\Delta V_r$. The voltage pulse signal $\Delta V_r$ is converted to a current signal by the conventional V-TO-I converter 232 representative of the output node 208 of the analog computing engine 222. This signal also represents the processing of the signal e(z) by the discrete-time lead-lag transfer function mentioned above. The summer 230 exchanges a charge from CP0 through CP1 as shown in Table 3.

TABLE 3

Summer

|    | CP3  | CP2  | CP1  | CP0  |
|----|------|------|------|------|
| C1 | ΔVr  | G    | G    | G    |
| C2 | G    | G    | G    | ΔVr  |
| C3 | G    | G    | ΔVr  | G    |
| C0 | G    | ΔVr  | G    | G    |
| C1 | ΔVr  | G    | G    | G    |

It will be appreciated that, alternatively, the single clock delay $z^{-1}$ element 226, and the summer 230 can be implemented with a two-by-two version of the discrete-time analog queuing element 218 of FIG. 13 with two phase clocking.

Figure 16:
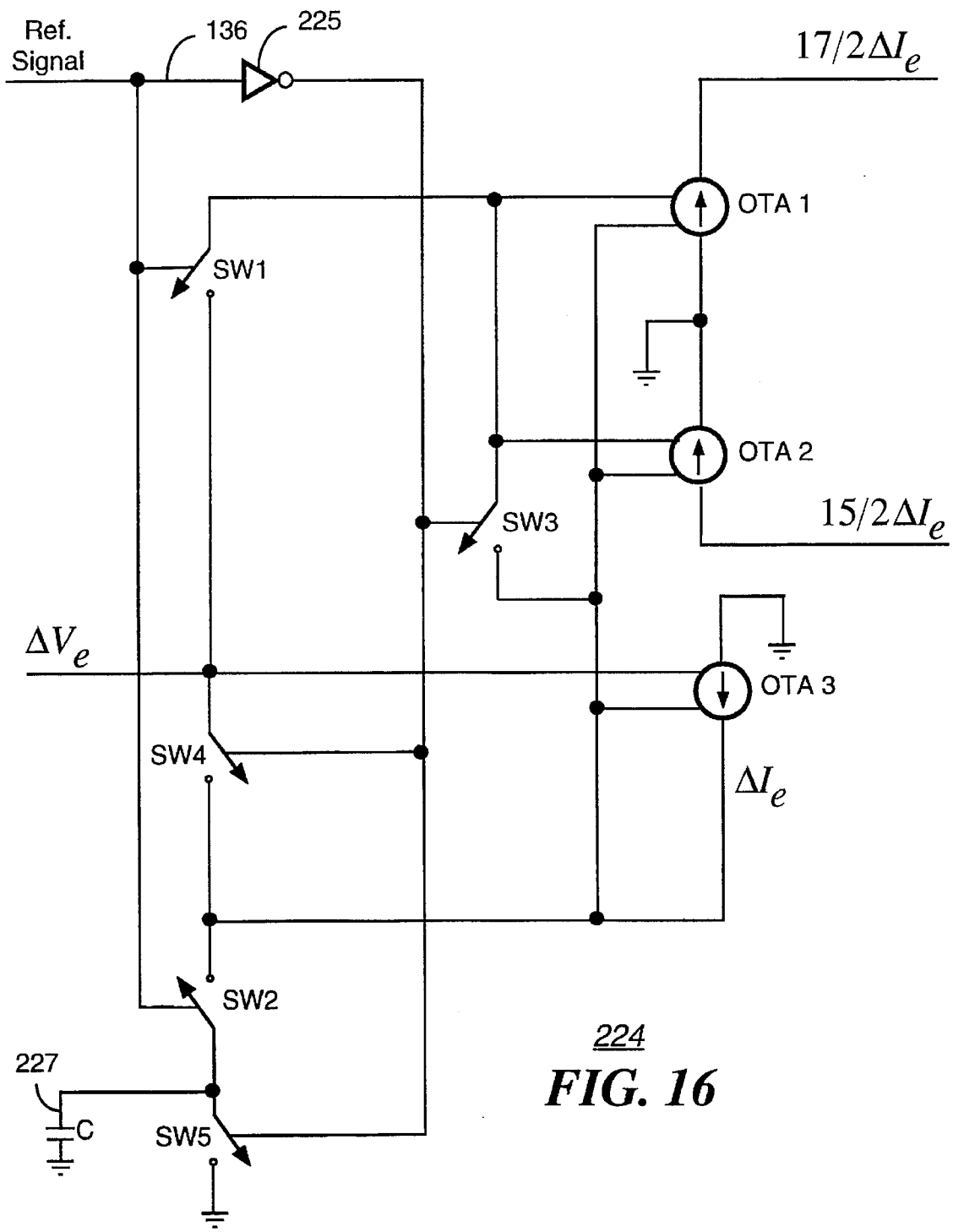
FIG. 16 is a detailed electrical block diagram of a scaled multiple output charge transfer circuit in accordance with the preferred embodiment of the present invention.

FIG. 16 is a detailed electrical block diagram of the scaled multiple output charge transfer circuit 224 in accordance with the preferred embodiment of the present invention. The scaled multiple output charge transfer circuit 224 includes three operational transconductance amplifiers (OTA 1, OTA 2 and OTA 3 shown by way of example). The OTAs are conventional transconductance circuits, such as described in "Analog VLSI and Neural Systems" by Carver Mead, pp 67–82. The scaled multiple output charge transfer circuit 224 further includes switches (SW1, SW2, SW3, SW4 and SW5 shown by way of example) which can be realized by utilizing transmission gate switches, similar to the Motorola MC4066. The scaled multiple output charge transfer circuit 224 also includes a conventional logic inverter 225 for inverting the reference signal 136, and a reference charge storage element 227. As mentioned above, the scaled multiple output charge transfer circuit 224 has two inputs which include the reference signal 136 and the voltage signal $\Delta V_e$, and two outputs comprising the currents pulse signals $(17/2)\Delta I_e$ and $-(15/2)\Delta I_e$.

The switches shown are active-high switches (i.e., they close with a logic "1" signal). When the reference signal 136 is in a low state (i.e., "0"), switches SW3, SW4 and SW5 are closed, and switches SW1 and SW2 are open. This is considered the reset state of the scaled multiple output charge transfer circuit 224. In this state the closure of switch SW3 and SW4 cause a circuit short circuit across the differential inputs of OTA 1, OTA 2 and OTA 3. Additionally, closure of S5 discharges the reference charge storage element 227.

When the reference signal 136 is active (i.e., a logic "1" signal) switches SW1 and SW2 are closed while switches SW3, SW4 and SW5 are open. At the same time the voltage signal $\Delta V_e$ is provided at the input of the scaled multiple signal output charge transfer circuit 224. The voltage signal $\Delta V_e$ is connected to the upper terminals of OTA 1, OTA 2 and OTA 3. OTA 3 charges the reference charge storage element 227 to the same level as $\Delta V_e$. Charging to $\Delta V_e$ requires an electric charge of $\Delta V_e \times c$. This charge is delivered from OTA 3 in the form of a current pulse $\Delta I_e$ as shown. The upper OTAs 1 and 2, operate as current mirrors scaled to factors of 17/2 and −15/2 of $\Delta I_e$, respectively. Once the differential terminals of OTAs 1, 2 and 3 are at the same voltage, the current pulse ceases. Before the next rising edge of the reference signal 136, the OTAs and the reference charge storage element 227 are reset as described above.

Figure 17:
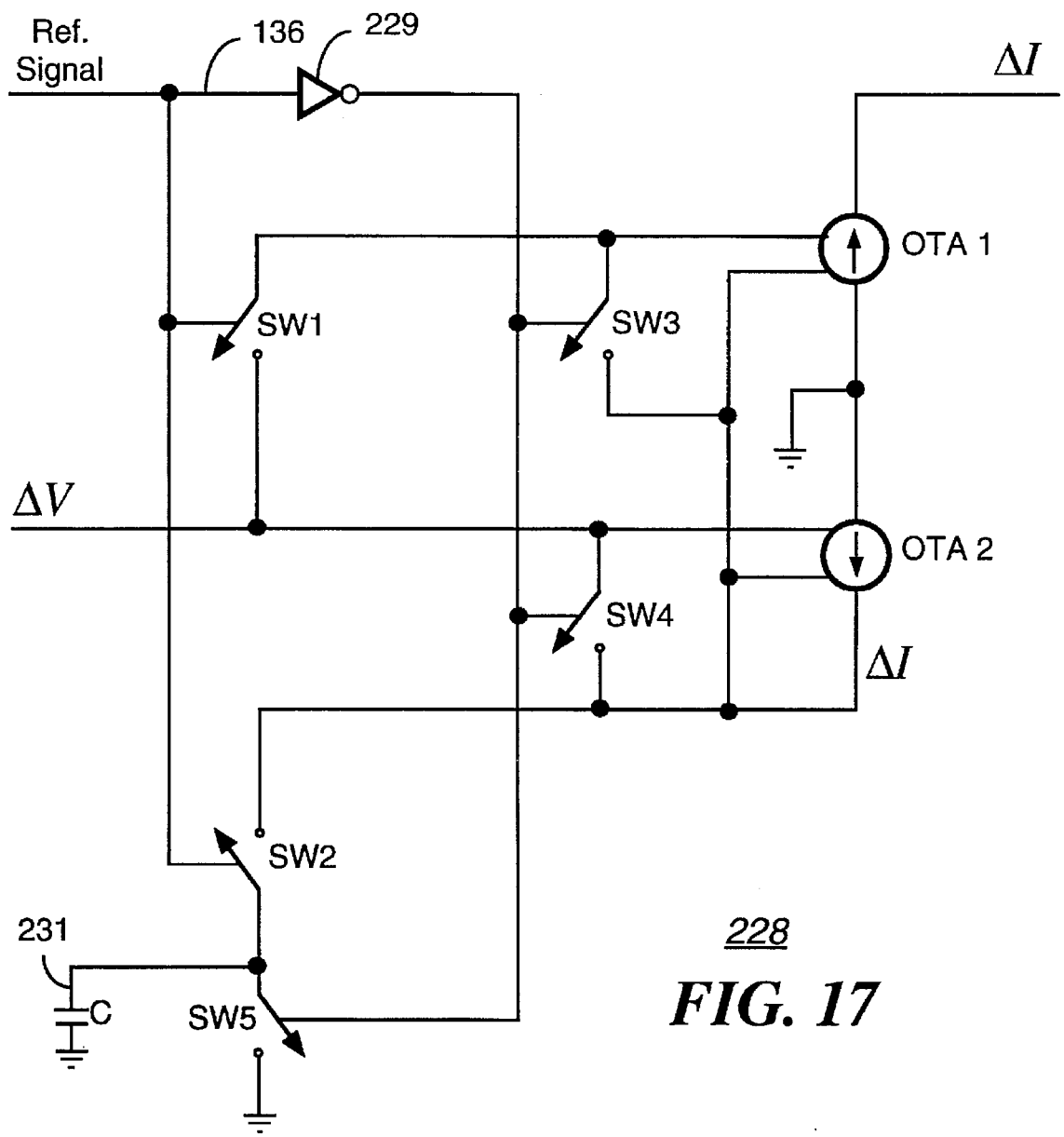
FIG. 17 is a detailed electrical block diagram of a single output charge transfer circuit in accordance with the preferred embodiment of the present invention.

FIG. 17 is a detailed electrical block diagram of the single output charge transfer circuit 228 in accordance with the preferred embodiment of the present invention. This circuit operates similar to the circuit of FIG. 16 with the exception that the circuit provides a single output and is scaled for a one to one ratio. The single output charge transfer circuit 228 includes five switches, two OTAs, a reference charge storage element 231, and a logic inverter 229. As mentioned above, the single output charge transfer circuit 228 has two inputs comprising the reference signal 136 and the voltage signal ΔV, and one output comprising the current signal ΔI.

The single output charge transfer circuit 228 is in the reset state when the reference signal 136 is in the low state. In this state switches SW3, SW4 and SW5 are closed while SW1 and SW2 are open. As before, the differential inputs of the OTAs are shorted, and the reference charge storage element 231 is discharged to ground. When the reference signal 136 becomes active switches SW1 and SW2 are closed while switches SW3, SW4 and SW5 are open. At the same time that the reference signal 136 becomes active, the signal ΔV is provided at the input of the single output charge transfer circuit 228. The voltage signal ΔV is connected to the upper terminals of OTA 1 and OTA 2. OTA 2 charges the reference charge storage element 231 to the same level as ΔV. Charging to ΔV requires an electric charge of ΔV×c. This charge is delivered from OTA 2 in the form of a current pulse ΔI as shown. OTA 1 operates as a current mirror which delivers the signal ΔI at the output. Once the differential terminals of OTAs 1 and 2 are at the same voltage, the current pulse ceases. Before the rising edge of the reference signal 136, the OTAs and the reference charge storage element 231 are reset as described above.

Figure 18:
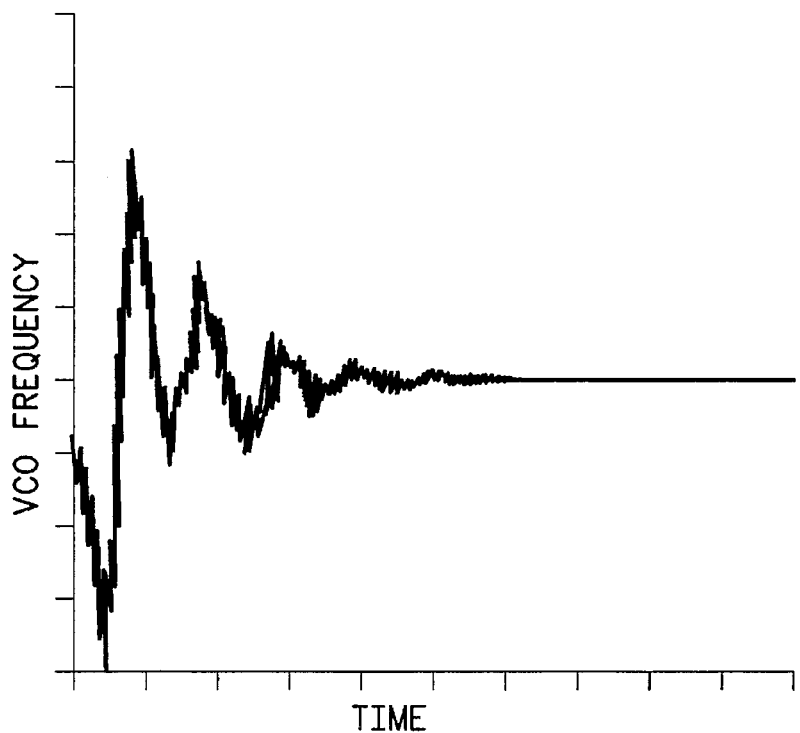
FIG. 18 depicts a simulation illustrating the performance of the phase-lock loop utilizing a controller design a which implements a lead-lag network in the continuous-time domain.

FIG. 18 depicts a simulation illustrating the performance of the phase-lock loop (PLL) utilizing a controller design which implements a lead-lag network in the continuous-time domain; that is, which follows the expression $$H(s) = \frac{\frac{s}{\omega_z} + 1}{\frac{s}{\omega_p} + 1}, \text{ or } H(s) = \frac{\frac{s}{(0.0175\omega_{ref})} + 1}{\frac{s}{(0.28\omega_{ref})} + 1}.$$

This implementation has two drawbacks. First, the implementation of the lead-lag network requires external components outside of the integrated circuit. This option is costly, and contributes to manufacturing defects. Second, and most importantly, the signal is very noisy as can be seen in FIG. 18. This noise degrades the performance and accuracy of the PLL.

Figure 19:
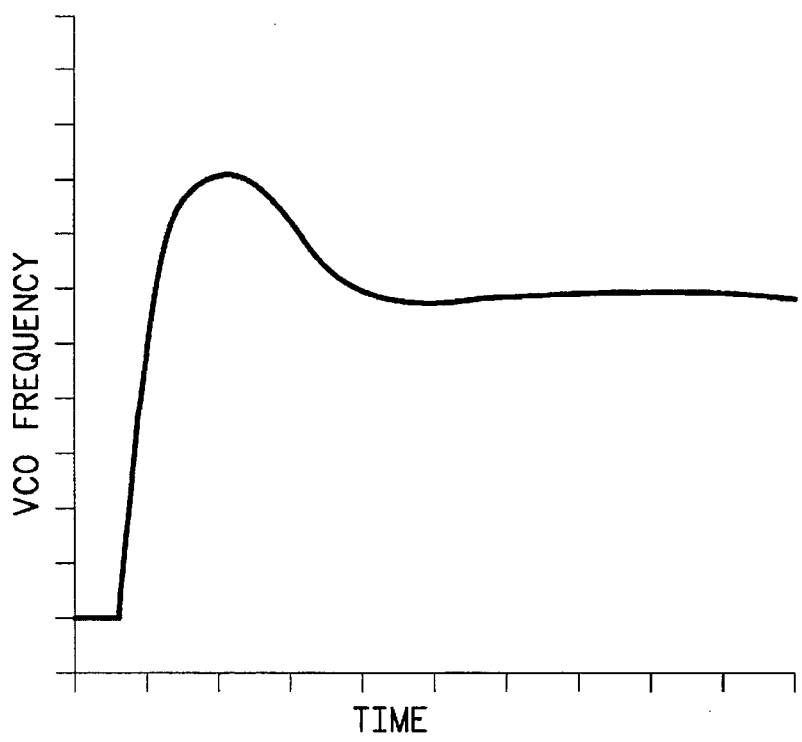
FIG. 19 depicts a simulation illustrating the performance of the phase lock loop utilizing a lead-lag network implemented in the discrete-time domain.

FIG. 19 depicts a simulation illustrating the performance of the phase lock loop utilizing the discrete-time analog computing element 206. This element, as described above utilizes a discrete-time lead lag transfer function following the expression $$H(z) = \frac{17 - 15z^{-1}}{2}.$$

The implementation of the PLL utilizing the discrete-time analog computing element 206 overcomes the disadvantages of the continuous-time domain implementation of the lead-lag network. Additionally, implementation of the discrete-time lead lag transfer function utilizing the discrete-time analog computing element 206 requires far less power than performing the same function digitally. Moreover, the simple architecture of the discrete-time analog queuing elements 218 reduces routing in the integrated circuit which thereby reduces the die size of the integrated circuit chip. The reduction in die size reduces overall cost, power consumption, and improves die yield at a wafer scale.

One of ordinary skill in the art will appreciate that, while the synthesizer 143 in accordance with the present invention has been described as a component of the communication receiver 100, there are many other appropriate and useful applications. For example, the synthesizer 143 can be used as well to provide a reference frequency for exciting a transmitter and further utilized as a clock generator for a processor. In addition, it will be appreciated that the discrete-time analog computing element 206 and the discrete-time analog queuing element 218 in accordance with the present invention can be utilized as well in many other communication applications where low-power discrete-time computations and/or discrete-time sample queuing are desired. These and other applications that may occur to one of ordinary skill in the art do not depart from the scope and intent of the claimed instant invention.

Thus, it should be apparent by now that the present invention provides an apparatus for performing discrete-time analog queuing and computing in a communication system. In particular, the invention advantageously provides a novel apparatus which requires minimal external components, is low in power consumption, and minimizes integrated circuit routing thereby reducing die size, and improving manufacturing yield. Moreover, the apparatus significantly improves noise and frequency stability performance when compared to traditional continuous-time implementations.

What is claimed is:

1. A discrete-time analog queuing element, comprising:
    N analog signal lines, wherein N is a positive integer;
    N analog storage lines;
    $N^2$ controllable switches, each controllable switch of the $N^2$ controllable switches coupled between each of the N analog signal lines and each of the N analog storage lines;
    N charge storage elements, each charge storage element of the N charge storage elements coupled between each of the N analog storage lines and a common circuit node; and
    N control lines, each control line coupled to N of the $N^2$ controllable switches, the control lines for controlling the controllable switches such that in response to the control lines being activated in a predetermined sequence, each of the analog storage lines is coupled in turn to each of the analog signal lines in a sequence having a predetermined rotating order, wherein the predetermined rotating order is identical for each of the analog storage lines, except that the sequence corresponding to each of the analog storage lines begins with a different one of the analog signal lines.

2. The discrete-time analog queuing element of claim 1, wherein an analog signal line of the N analog signal lines is coupled to a reference circuit node for setting a predetermined charge and s resultant voltage on a charge storage element of the N charge storage elements in response to the analog signal line being coupled to the charge storage element through one of the $N^2$ controllable switches, and
    wherein at least one of the analog signal lines is an input for receiving at least one discrete-time analog input signal, and
    wherein at least one of the analog signal lines is an output for delivering at least one discrete-time output signal.

3. The discrete-time analog queuing element of claim 1, further comprising at least one charge transfer circuit, comprising:
    an input for receiving an input voltage change; and
    an output coupled to one of the analog signal lines for delivering thereto a charge proportional to the input voltage change.

4. The discrete-time analog queuing element of claim 1, further comprising at least one charge transfer circuit, comprising:
    an input coupled to one of the analog signal lines for receiving therefrom an input voltage change; and
    an output for providing a charge proportional to the input voltage change.

5. A discrete-time analog computing element, comprising:
    an input node coupled to at least one discrete-time analog queuing element for receiving a discrete-time analog input signal;
    an output node coupled to the at least one discrete-time analog queuing element for providing a computed output signal responsive to the discrete-time analog input signal;
    a clock and logic circuit coupled to the at least one discrete-time analog queuing element for generating a plurality of control signals activated in a predetermined sequence; and
    the at least one discrete-time analog queuing element, comprising:
        N analog signal lines, wherein N is a positive integer;
        N analog storage lines;
        $N^2$ controllable switches, each controllable switch of the $N^2$ controllable switches coupled between each of the N analog signal lines and each of the N analog storage lines;
        N charge storage elements, each charge storage element of the N charge storage elements element coupled between each of the N analog storage lines and a common circuit node; and
        N control lines, each control line coupled to N of the $N^2$ controllable switches and coupled to the clock and logic circuit, the N control lines for controlling the controllable switches such that in response to the control lines being activated in the predetermined sequence, each of the analog storage lines is coupled in turn to each of the analog signal lines in a sequence having a predetermined rotating order, wherein the predetermined rotating order is identical for each of the analog storage lines, except that the sequence corresponding to each of the analog storage lines begins with a different one of the analog signal lines.

6. The discrete-time analog computing element of claim 5, wherein an analog signal line of the N analog signal lines is coupled to a reference circuit node for setting a predetermined charge and resultant voltage on a charge storage element of the N charge storage elements in response to the analog signal line being coupled to the charge storage element through one of the $N^2$ controllable switches, and wherein at least one of the analog signal lines is an input for receiving at least one discrete-time analog input signal, and wherein at least one of the analog signal lines is an output for delivering at least one discrete-time output signal.

7. The discrete-time analog computing element of claim 5, wherein the at least one discrete-time analog queuing element further comprises at least one charge transfer circuit, comprising:

an input for receiving an input voltage change; and an output coupled to one of the analog signal lines for delivering thereto a charge proportional to the input voltage change.

8. The discrete-time analog computing element of claim 5, wherein the at least one discrete-time analog queuing element further comprises at least one charge transfer circuit, comprising:

an input coupled to one of the analog signal lines for receiving therefrom an input voltage change; and an output for providing a charge proportional to the input voltage change.

9. A discrete-time phase locked loop, comprising:

a phase error detector having a discrete-time pulse width modulation (DTPWM) output signal, the phase error detector coupled to a reference signal and coupled to a generated signal for detecting a phase difference between the reference signal and the generated signal; and a discrete-time analog computing element, comprising:

an input node coupled to the phase error detector and coupled to at least one discrete-time analog queuing element for receiving the DTPWM output signal;

an output node coupled to the at least one discrete-time analog queuing element for providing a computed output signal responsive to the DTPWM output signal of the phase error detector;

a clock and logic circuit coupled to the at least one discrete-time analog queuing element for generating a plurality of control signals activated in a predetermined sequence; and the at least one discrete-time analog queuing element, comprising:

N analog signal lines, wherein N is a positive integer;

N analog storage lines;

$N^2$ controllable switches, each controllable switch of the $N^2$ controllable switches coupled between each of the N analog signal lines and each of the N analog storage lines;

N charge storage elements, each charge storage element of the N charge storage elements coupled between each of the N analog storage lines and a common circuit node; and N control lines, each control line coupled to N of the $N^2$ controllable switches and coupled to the clock and logic circuit, the N control lines for controlling the controllable switches such that in response to the control lines being activated in the predetermined sequence, each of the analog storage lines is coupled to each of the analog signal lines in a sequence having a predetermined rotating order, wherein the predetermined rotating order is identical for each of the analog storage lines, except that the sequence corresponding to each of the analog storage lines begins with a different one of the analog signal lines, wherein the discrete-time phase locked loop further comprises a controlled oscillator coupled to the output node of the descrete-time analog computing element for producing the generated signal.

10. The discrete-time phase locked loop of claim 9, wherein an analog signal line of the N analog signal lines is coupled to a reference circuit node for setting a predetermined charge and resultant voltage on a charge storage element of the N charge storage elements in response to the analog signal line being coupled to the charge storage element through one of the $N^2$ controllable switches, and wherein at least one of the analog signal lines is an input for receiving at least one discrete-time analog input signal, and wherein at least one of the analog signal lines is an output for delivering at least one discrete-time output signal.

11. The discrete-time phase locked loop of claim 9, wherein the at least one discrete-time analog queuing element further comprises at least one charge transfer circuit, comprising:

an input for receiving an input voltage change; and an output coupled to one of the analog signal lines for delivering thereto a charge proportional to the input voltage change.

12. The discrete-time phase locked loop of claim 9, wherein the at least one discrete-time analog queuing element further comprises at least one charge transfer circuit, comprising:

an input coupled to one of the analog signal lines for receiving therefrom an input voltage change; and an output for providing a charge proportional to the input voltage change.

13. The discrete-time phase locked loop of claim 9, wherein the controlled oscillator produces a desired signal operating at a desired frequency, and wherein the controlled oscillator comprises a frequency divider coupled to the desired signal for frequency dividing the desired signal to produce the generated signal.

14. A communication receiver, comprising:

an antenna for intercepting a signal including information;

a receiver element coupled to the antenna for demodulating the signal to derive the information;

a processor coupled to the receiver element for processing the information;

a synthesizer coupled to the processor for producing a generated signal utilized by the communication receiver, the synthesizer comprising:

a reference oscillator for generating a reference signal; and a discrete-time phase locked loop, comprising:

a phase error detector having a discrete-time pulse width modulation (DTPWM) output signal, the phase error detector coupled to the reference oscillator for receiving the reference signal and coupled to the generated signal for detecting a phase difference between the reference signal and the generated signal; and a discrete-time analog computing element, comprising:

an input node coupled to the phase error detector and coupled to at least one discrete-time analog queuing element for receiving the DTPWM output signal;

an output node coupled to the at least one discrete-time analog queuing element for providing a computed output signal responsive to the DTPWM output signal of the phase error detector;

a clock and logic circuit coupled to the at least one discrete-time analog queuing element for generating a plurality of control signals activated in a predetermined sequence; and the at least one discrete-time analog queuing element, comprising:

N analog signal lines, wherein N is a positive integer;

N analog storage lines;

$N^2$ controllable switches, each controllable switch of the $N^2$ controllable switches coupled between each of the N analog signal lines and each of the N analog storage lines;

N charge storage elements, each charge storage element of the N charge storage elements coupled between each of the N analog storage lines and a common circuit node; and N control lines, each control line coupled to N of the $N^2$ controllable switches and coupled to the clock and logic circuit, the N control lines for controlling the controllable switches such that in response to the control lines being activated in the predetermined sequence, each of the analog storage lines is coupled in turn to each of the analog signal lines in a sequence having a predetermined rotating order, wherein the predetermined rotating order is identical for each of the analog storage lines, except that the sequence corresponding to each of the analog storage lines begins with a different one of the analog signal lines, wherein the discrete-time phase locked loop further comprises a controlled oscillator coupled to the output node of the discrete-time analog computing element for producing the generated signal.

15. The communication receiver of claim 14, wherein an analog signal line of the N analog signal lines is coupled to a reference circuit node for setting a predetermined charge and resultant voltage on a charge storage element of the N charge storage elements in response to the analog signal line being coupled to the charge storage element through one of the $N^2$ controllable switches, and wherein at least one of the analog signal lines is an input for receiving at least one discrete-time analog input signal, and wherein at least one of the analog signal lines is an output for delivering at least one discrete-time output signal.

16. The communication receiver of claim 14, wherein the at least one discrete-time analog queuing element further comprises at least one charge transfer circuit, comprising:

an input for receiving an input voltage change; and an output coupled to one of the analog signal lines for delivering thereto a charge proportional to the input voltage change.

17. The communication receiver of claim 14, wherein the at least one discrete-time analog queuing element further comprises at least one charge transfer circuit, comprising:

an input coupled to one of the analog signal lines for receiving therefrom an input voltage change; and an output for providing a charge proportional to the input voltage change.

18. The communication receiver of claim 14, wherein the controlled oscillator produces a desired signal operating at a desired frequency, and wherein the controlled oscillator comprises a frequency divider coupled to the desired signal for frequency dividing the desired signal to produce the generated signal.

\* \* \* \* \*

UNITED STATES PATENT AND TRADEMARK OFFICE
CERTIFICATE OF CORRECTION

PATENT NO. : 5,651,037
DATED : July 22, 1997
INVENTOR(S) : Barrett et al.

It is certified that error appears in the above-indentified patent and that said Letters Patent is hereby corrected as shown below:

Column 17, line 65, after "coupled" insert -- in turn--

Signed and Sealed this

Third Day of March, 1998

BRUCE LEHMAN

Attest:

Attesting Officer

Commissioner of Patents and Trademarks